United States Patent
Shaeffer et al.

(10) Patent No.: US 8,884,710 B2
(45) Date of Patent: Nov. 11, 2014

(54) GYROSCOPE WITH PHASE AND DUTY-CYCLE LOCKED LOOP

(75) Inventors: Derek Shaeffer, Redwood City, CA (US); Ahingsa Soukhaphanith, San Jose, CA (US)

(73) Assignee: Invensense, Inc., San Jose, CA (US)

(*) Notice: Subject to any disclaimer, the term of this patent is extended or adjusted under 35 U.S.C. 154(b) by 65 days.

(21) Appl. No.: 13/335,815

(22) Filed: Dec. 22, 2011

(65) Prior Publication Data
US 2013/0099836 A1 Apr. 25, 2013

Related U.S. Application Data

(60) Provisional application No. 61/551,314, filed on Oct. 25, 2011.

(51) Int. Cl.
*H03B 5/30* (2006.01)
*H03L 7/08* (2006.01)
*G01C 19/5776* (2012.01)

(52) U.S. Cl.
CPC ............... *G01C 19/5776* (2013.01); *H03L 7/08* (2013.01)

USPC .......... 331/154; 331/96; 331/16; 331/34; 327/156; 327/159

(58) Field of Classification Search
CPC .............. G01C 19/5776; H03L 7/08
USPC ............ 331/154, 96, 1 A, 34, 16; 73/504.12; 327/156, 147
See application file for complete search history.

(56) References Cited

U.S. PATENT DOCUMENTS

| | | | | |
|---|---|---|---|---|
| 6,198,355 | B1* | 3/2001 | Lindquist et al. | 331/27 |
| 7,907,027 | B2* | 3/2011 | Partridge et al. | 331/154 |
| 8,156,805 | B2* | 4/2012 | Hayner et al. | 73/504.12 |
| 8,395,427 | B1* | 3/2013 | Gao et al. | 327/156 |

* cited by examiner

*Primary Examiner* — Arnold Kinkead
(74) *Attorney, Agent, or Firm* — Sawyer Law Group, P.C.

(57) ABSTRACT

A system and method in accordance with the present invention provides a gyroscope incorporating an improved PLL technique. The improved PLL auto-corrects its own reference low-frequency noise, thereby eliminating this source of noise, improving the noise performance of the gyroscope and allowing a compact implementation. The net result is a gyroscope with improved bias stability that can meet noise requirements with a smaller footprint.

12 Claims, 9 Drawing Sheets

Figure 1

Prior Art

GYROSCOPE WITH PHASE AND DUTY-CYCLE LOCKED LOOP

CROSS-REFERENCE TO RELATED APPLICATION

Under 35 U.S.C. 119(e), this application claims priority benefit to U.S. provisional application No. 61/551,314 filed on Oct. 25, 2011.

FIELD OF THE INVENTION

The present invention relates generally to gyroscopes and more particularly to gyroscopes employing phase- and duty-cycle-locked loops.

BACKGROUND OF THE INVENTION

Conventional phase-locked loops (PLL's) utilized in gyroscopes use a single edge of the reference clock for phase comparison. Such PLL's are vulnerable to low-frequency jitter which arises due to phase modulation of a sinusoidal reference clock source when noise is added to it. This additive noise is converted to duty-cycle error, and subsequently phase noise, when the sinusoidal reference clock is converted to logic levels by a comparator or similar circuit. This becomes a serious limitation when a conventional PLL is used in the demodulator path of a rate gyroscope. Conventional duty-cycle correction methods would directly monitor the duty cycle by averaging the "high" and "low" times of the comparator output, and driving this average to zero. However, such techniques suffer from low-frequency noise added by the duty-cycle measuring circuit. A system and method in accordance with the present invention addresses these issues.

SUMMARY OF THE INVENTION

A system and method in accordance with the present invention provides a gyroscope based on an improved phase locked loop (PLL) technique. The improved PLL auto-corrects its own reference low-frequency noise, thereby eliminating this source of noise, improving the noise performance of the gyroscope and allowing a compact implementation. The net result is a gyroscope with improved bias stability that can meet noise requirements with a smaller footprint.

DETAILED DESCRIPTION

The present invention relates generally to gyroscopes and more particularly to phase- and duty-cycle-locked loops utilized in gyroscopes. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

A system and method in accordance with the present provides the following features:

Phase comparison operates on both edges of the clock, so that the effect of additive noise on the timing of those edges is averaged out in the PLL. Thereby, conversion of additive low-frequency reference noise to phase noise is avoided.

Duty-cycle is further detected by re-using the phase-frequency detector of the PLL to compare both edges of the clock to the PLL feedback clock and infer a duty-cycle error from timing errors. The duty-cycle error is corrected by applying the detected error to an integrator which adjusts a D.C. offset in the clock comparator. Thereby, spurious PLL products due to performing phase comparisons on both edges of the clock are avoided.

The resulting arrangement comprises a system of two orthogonal feedback loops—one for phase, another for duty-cycle—which both relate to a common phase/frequency/duty-cycle detector circuit.

By detecting and correcting duty-cycle errors by comparing and aligning edge crossings, the present invention provides a significant improvement in noise performance compared to conventional duty-cycle correction techniques, thereby enabling low-noise operation and a compact implementation suitable for a gyroscope.

Figure 1:
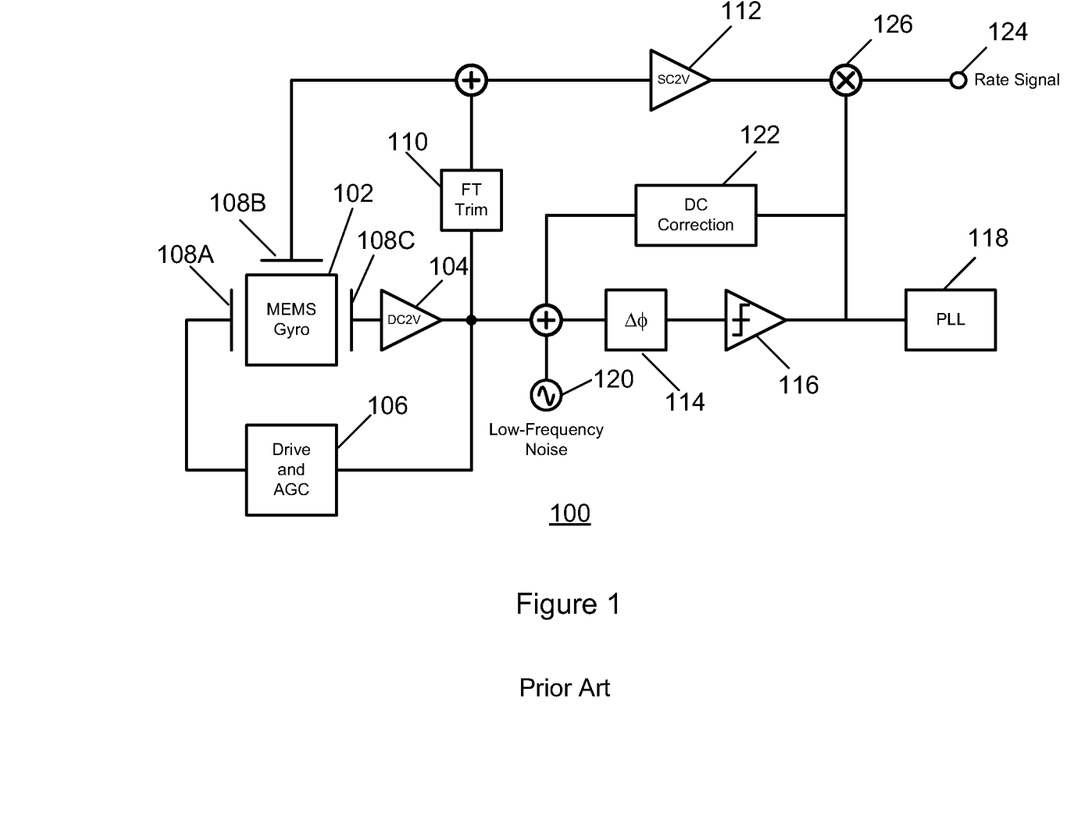
FIG. 1 shows a conventional MEMS rate gyroscope.

FIG. 1 shows a conventional micro-electromechanical system (MEMS) rate gyroscope system 100, comprising a MEMS gyroscope 102 that is driven to oscillation with a drive loop comprising a drive capacitance-to-voltage (C2V) amplifier (DC2V) 104 coupled to a MEMS drive-sense terminal 108C and a drive/AGC block 106 that close a positive feedback loop around the MEMS gyroscope 102. When oscillating, the MEMS gyroscope 102 provides a second output via a MEMS sense terminal 108B coupled to a sense C2V amplifier (SC2V) 112 which senses a change in MEMS capacitance in response to a Coriolis force that results when the gyroscope 102 is rotated. Due to mechanical imperfections in the MEMS gyroscope 102, some portion of the drive signal may inadvertently couple to a sense port 108B of the MEMS gyroscope 102. To cancel this unwanted signal, a feedthrough (FT) trim block 110 couples the DC2V 104 output to the SC2V 112 input. After feedthrough cancellation, the output of the SC2V 112 is an amplitude modulated signal whose carrier frequency is the oscillation frequency of the drive loop and whose modulation conveys the rate of rotation. The phase of the desired signal carrying information about the rate of rotation exhibits a 90-degree phase offset compared to the DC2V 104 output. The SC2V 112 output is coupled to a signal input of demodulator 126 and is demodulated to baseband to recover the rate signal 124. The demodulator 126 has a clock input receiving a phase shifted version of the DC2V 104 output signal so that the demodulator signal and clock inputs have substantially the same carrier phase for proper demodulation. The required phase shift is approximately 90-degrees, owing to the nominal phase offset between SC2V 112 and DC2V 104 outputs. This phase shift can be generated by using a 90-degree phase shifter (such as an integrator 114 or other suitable analog filter), followed by a comparator 116 to convert the sinusoidal output of the phase shifter to a square-wave output for use in demodulation. In some embodiments, this square-wave output may also be applied to a phase-locked loop (PLL) 118 for use as a system clock.

A critical issue that arises during this conversion is that low-frequency noise and offsets 120 present at the phase shifter 114 input contribute to duty-cycle error at the comparator 116 output, and this duty-cycle error can be a source of spurious demodulation products and noise. For this reason, a duty-cycle (DC) correction loop 122 monitors the comparator 116 output and feeds back a correction signal to the phase shifter input so that a substantially 50% duty cycle is maintained at the demodulator input.

A limitation of the technique of FIG. 1 is that the accuracy and stability of the phase shift is governed by an analog phase shifter and therefore subject to sensitivity to manufacturing and environmental variation.

Figure 2:
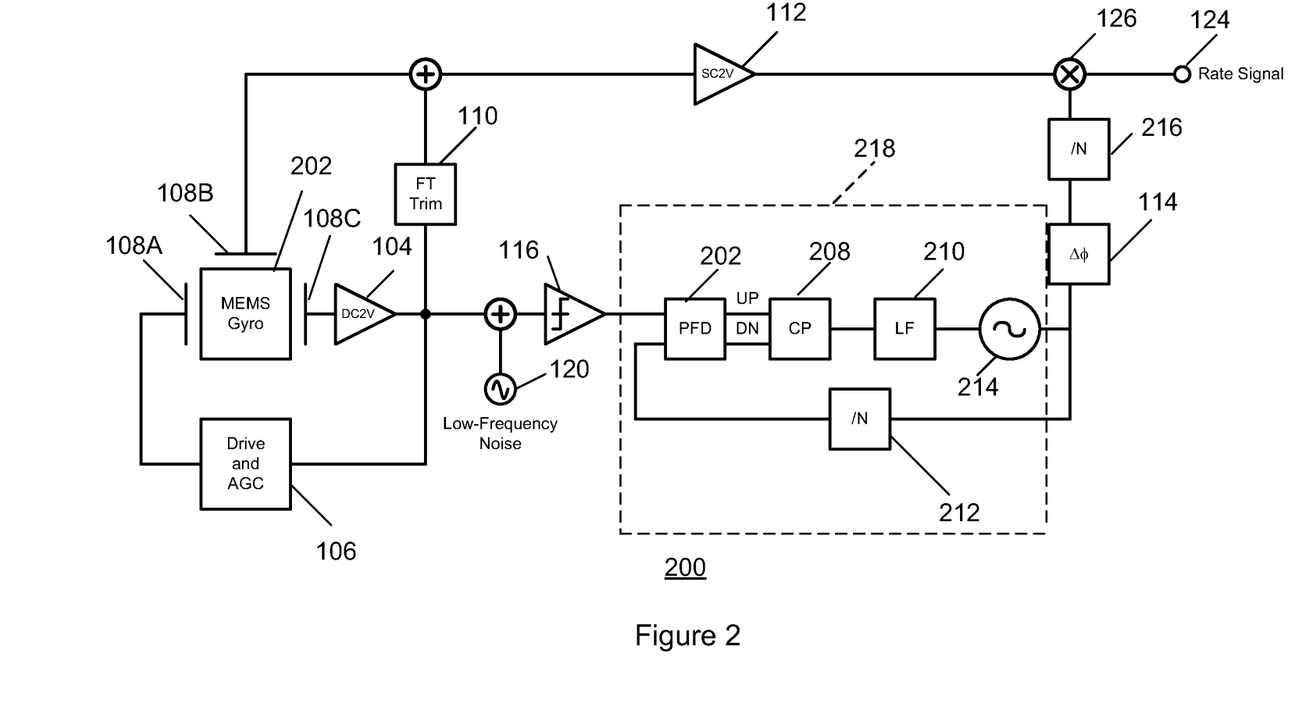
FIG. 2 is block diagram of a gyroscope in accordance with the present invention.

An improved gyroscope system 200 in accordance with the present invention eliminates an analog phase shifter and its related duty-cycle correction circuitry in favor of a phase-locked loop (PLL) 218, as illustrated in FIG. 2. In this embodiment, the output of the DC2V 104 is coupled to a comparator 116, which converts the sinusoidal DC2V 104 output signal into a square-wave signal. That signal serves as the reference clock for a PLL 218 comprising phase-frequency detector (PFD) 202, charge pump (CP) 208, loop filter (LF) 210, voltage-controlled oscillator (VCO) 214 and feedback divider 212. By virtue of the feedback divider 212, the PLL 218 multiplies the drive frequency by a factor of N. As the PLL 218 output frequency is a factor of N more than the drive frequency, there are N positive-edge transitions of the output clock for each cycle of the PLL reference clock. Considering only positive edge transitions, a phase resolution of 360-degrees divided by N is readily provided by use of a digital delay line. If positive and negative-edge transitions are considered, the resolution is improved to 180-degrees divided by N. The PLL 218 output clock couples to a phase shifter 114 based on this principle. The phase shifter 114 can be programmed by selecting the number of clock cycle delays relating the phase shifter input and output clocks. The output of the phase shifter 114 couples to a frequency divider 216 that divides the phase shifter 114 output clock frequency back down to the drive frequency. With a proper phase selection, the divider 216 output is at the proper frequency and phase for use in demodulation by demodulator 126.

The arrangement of FIG. 2 has the advantage of providing a very stable and programmable phase shift. The stability of the phase shift owes to the use of clock edges available at the PLL 218 output that precisely span one period of the drive oscillation.

A limitation of the embodiment of FIG. 2 is found in its susceptibility to low-frequency additive noise that may be present at the input of the comparator 116.

Figure 3A:
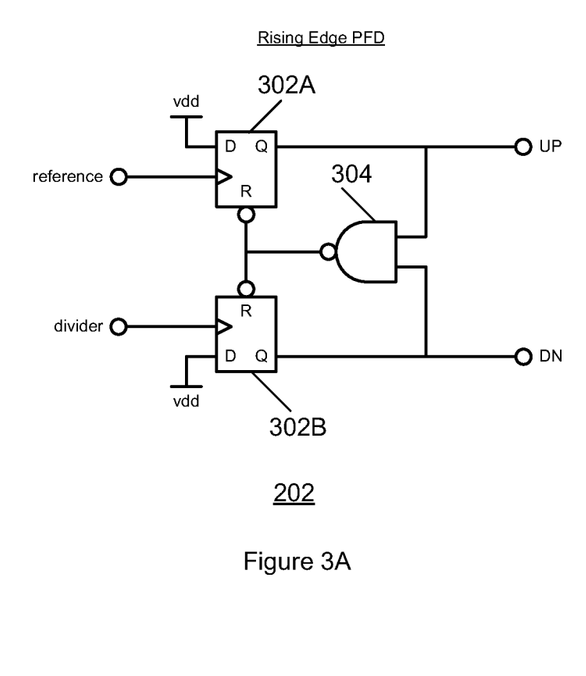
FIGS. 3A and 3B are block diagrams of two exemplary conventional phase-frequency detectors (PFD).
Figure 3B:
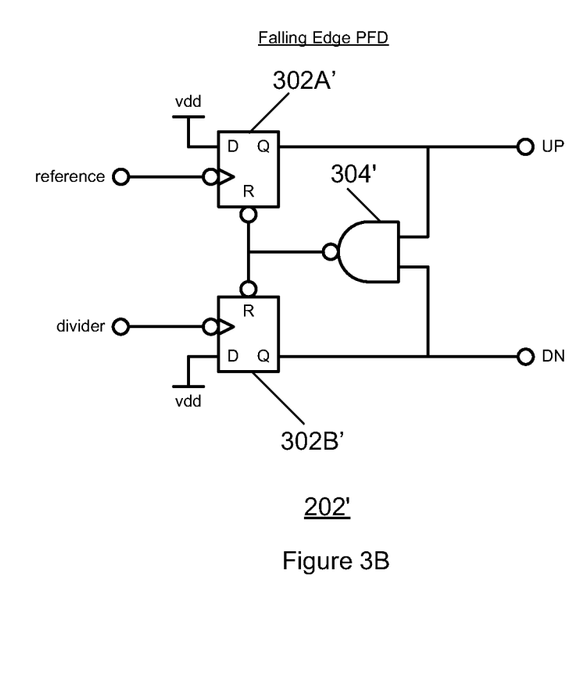

To understand how this additive noise affects the PLL 218 operation, it is useful to consider the operation of two exemplary phase-frequency detectors (PFD), shown in FIGS. 3A and 3B. In FIG. 3A, first exemplary PFD 202 comprises two D-flip-flops (D-FFs) 302A and 302B and a NAND gate 304.

Referring back to FIG. 2, the first exemplary PFD 202 compares rising edges of the reference and feedback clocks in the PLL 218. The principle of operation will be familiar to one skilled in the art and is summarized here for ease of reference. If a rising edge of the reference input arrives first, it is sensed by the first D-FF 302A and the UP signal is set. This signal persists until a rising edge of the divider input arrives and is detected by the second D-FF 302B. At that time, the DN signal is set momentarily. The condition where both UP and DN signals is set triggers a RESET of both D-FF's 302A and 302B. However, because the UP signal was set first, it has persisted for longer, thereby indicating that the reference is early and that the VCO frequency should be increased to allow the divider clock edge to catch up.

The opposite situation is found when the divider clock edge arrives first, in which case the reference is considered "late", and the VCO frequency should be decreased to allow the reference to catch up. When the edges of the reference and divider are aligned, the durations of UP and DN pulses are identical and equal to the reset delay of the D-FF 302A and 302B plus the delay of NAND gate 304. The exemplary falling edge PFD 202' works by the same principle, but operating on the falling edges of the clocks, rather than the rising edges.

Conventional PLL's may typically operate on one edge—rising, or falling—of the reference clock. Operation on both edges is generally avoided because duty-cycle errors in the reference clock will lead to static timing errors that cause instability of the PLL 218 output clock.

Figure 4A:
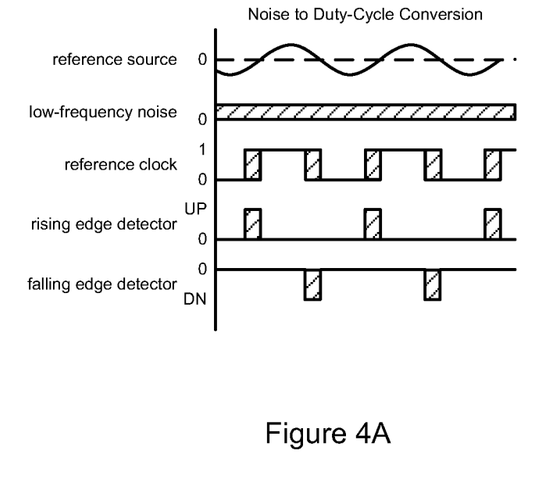
FIG. 4A illustrates how low-frequency noise affects a reference source sinusoidal waveform to produce duty-cycle error and phase error.

Now, consider the influence of low-frequency noise on PFD operation with reference to FIG. 4A. This figure illustrates a reference source sinusoidal waveform. This waveform is exemplary of the type of signal that might be provided by a DC2V. The zero-crossings of this signal may be sensed by a comparator to produce the reference clock shown in the diagram. When low-frequency noise is added to the reference source, the zero crossings are perturbed, resulting in uncertain and jittery edge placements in the reference clock waveform. In the exemplary waveforms of FIG. 4A, a low-frequency noise with a positive value is added to the reference source. The effect is to advance the positive-going transitions of the reference clock and to delay the negative going transitions, thereby causing duty-cycle distortion. Thus, additive low-frequency noise is converted to duty-cycle noise at the comparator output. A rising edge PFD will generate UP pulses of varying width in response to the rising edges with varying placements. Correspondingly, a falling edge PFD will generate DN pulses of varying width. In either case, the net effect will be to cause the PLL to track the varying reference edge timing, thereby converting duty-cycle noise at the PFD input into phase noise at the PLL output. This phase noise can cause performance degradation in the demodulator when it interacts with and demodulates residual quadrature at the output of the sense amplifier. For this reason, it would be desirable to have PFD whose output does not respond to duty-cycle errors produced by low-frequency noise.

Figure 4B:
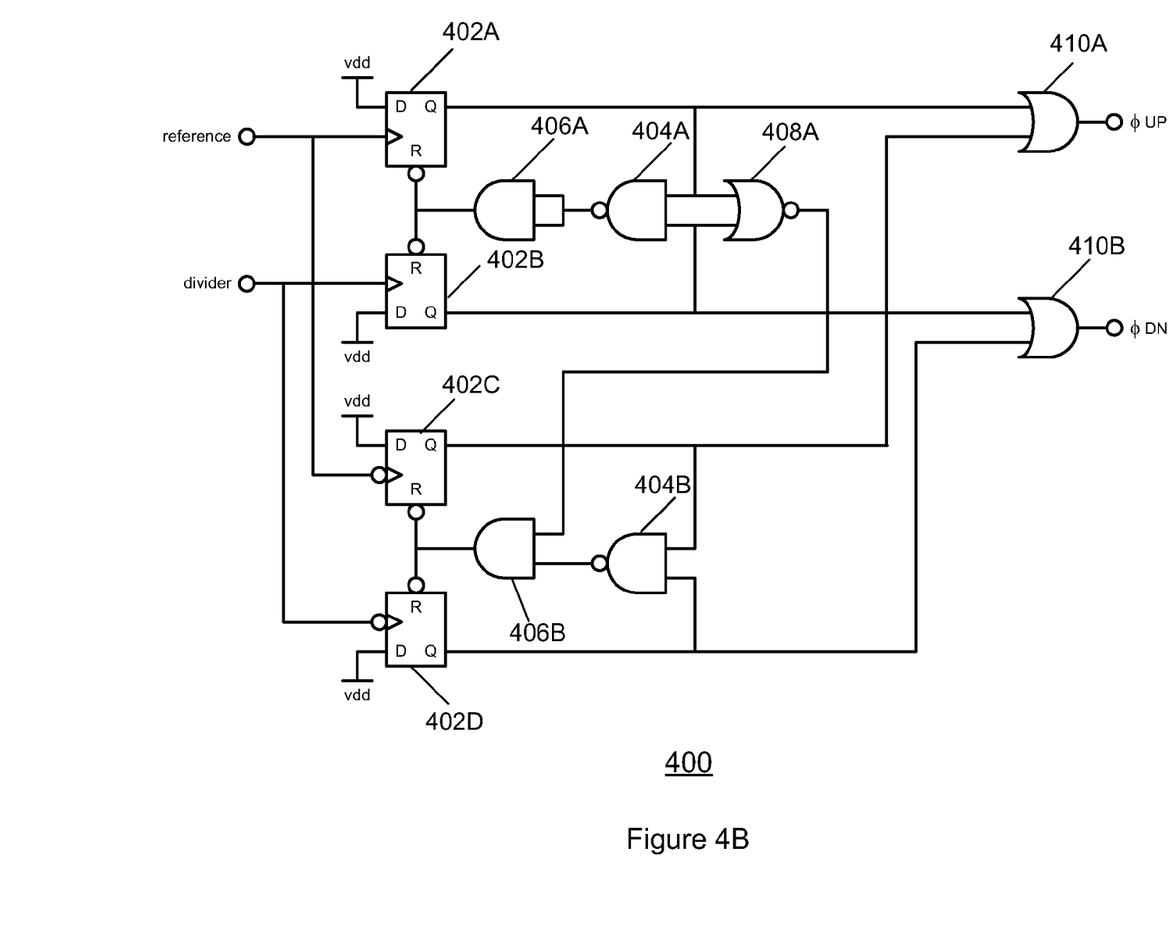
FIG. 4B illustrates a phase-frequency detector (PFD) in accordance with the present invention.

One solution in accordance with the present invention is shown in FIG. 4B. By combining a rising-edge PFD with a falling-edge PFD and summing their outputs, the average PFD output is no longer responsive to duty-cycle errors. This can be seen with reference to FIG. 4A which illustrates that rising- and falling-edge detectors produce pulses of equal magnitude but opposite polarity in response to the same low-frequency noise. This behavior derives from the fact that the rising and falling edges of the reference clock are respectively advanced and delayed by equal amounts.

In the embodiment of FIG. 4B, a positive edge PFD and a negative edge PFD are combined. The PFD 400 compares the edge timing of the two input clocks—reference and divider. The resulting pulses at the D-FF 402A-402D outputs are combined using OR gates 410A-410B to produce UP and DN pulses for the phase-locked loop. The phase-UP signal is formed by taking the OR of the two PFD UP signals. That is, the VCO frequency should be increased when the rising or falling edges of the reference clock are early on average with respect to the divider clock. In corresponding fashion, the phase-signal is formed by taking the logical OR of the two PFD outputs. The net effect is that the phase UP and DN signals relate to the sum of the two PFD outputs.

When the PFD is operating in its steady-state condition in the absence of reference duty-cycle error, the rising and falling edges of reference and divider clocks will be in very close alignment such that the average outputs of each PFD is zero. In this ideal operating condition, the two PFD's produce pulses of minimum pulsewidth on alternating half-cycles of the reference clock in "ping-pong" fashion, and thus the UP and DN outputs of OR gates 410A-410B produce minimum pulsewidth pulses on every half-cycle of the reference clock. The minimum pulsewidth is mostly determined by the reset delay through flip-flops 402A-402D and the propagation delay through gates 404A-404B and 406A-406B.

An alternate steady-state operating point is found where the average of the sum of the PFD outputs is zero, but the individual PFD outputs are non-zero. This lock point corresponds to the condition where the reference and divider clocks are 180-degrees out-of-phase and is associated with simultaneous half-period pulses of opposite polarity being produced by the PFDs. To avoid undesirable operation at this lock point, the PFD of FIG. 4B includes an "inhibit" circuit comprising an additional NOR gate 408A and AND gate 406B that allows the rising-edge PFD to inhibit operation of the falling-edge PFD. This circuit excludes any possibility of the PFD's producing simultaneous pulses and thereby enforces the "ping-pong" operation corresponding to the desired operating point.

By employing the improved PFD of FIG. 4B in the gyroscope system of FIG. 2, the generation of low-frequency phase noise and phase error by the PLL 218 in response to low-frequency noise and offset 120 is suppressed. However, although low-frequency noise and phase error are suppressed, the improved PFD nonetheless produces a pulsetrain comprising UP and DN pulses of alternating polarity in the presence of reference duty-cycle errors. This pulsetrain disturbs the operation of the PLL, producing objectionable high-frequency spurious products at the PLL output. For this reason, it would be desirable to suppress low-frequency noise directly at the comparator input.

Figure 5:
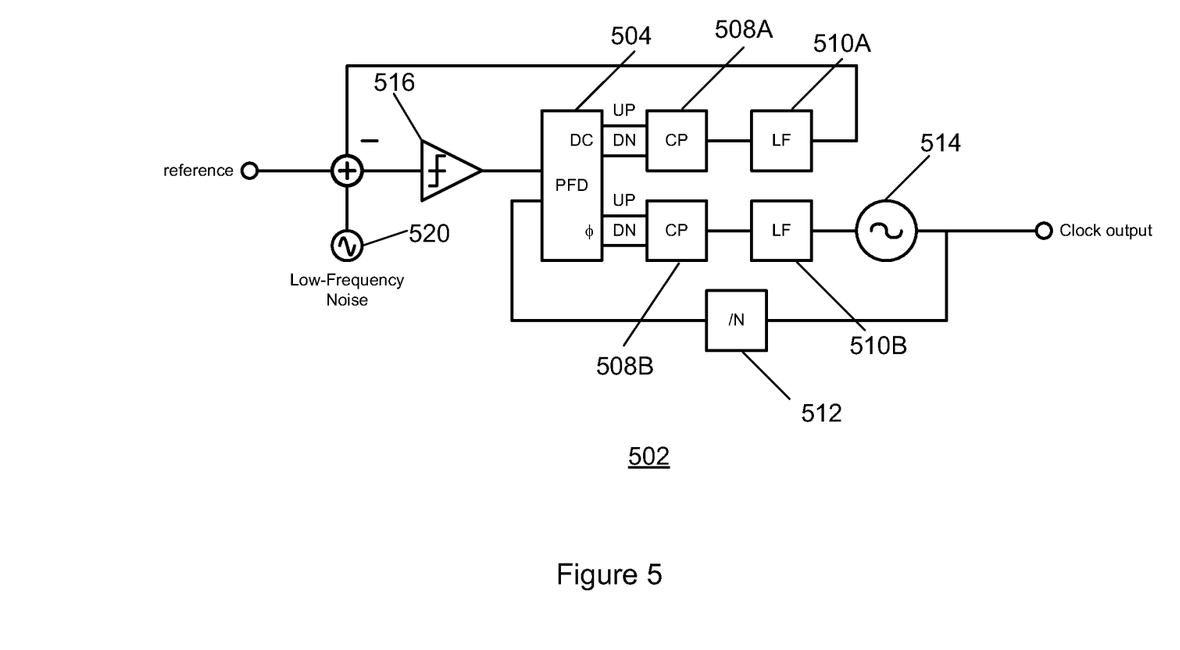
FIG. 5 is embodiment block diagram of a phase and duty-cycle locked loop (PDCLL) in accordance with the present invention.

An improved embodiment of the present invention that addresses this issue is shown in FIG. 5. In this diagram, the PLL 118 of FIG. 2 is augmented with a duty-cycle correction loop that operates with a detector 504. As one loop operates with respect to errors in reference clock phase and the other loop operates with respect to errors in reference clock duty-cycle, this system of both loops could be referred to as a phase-and-duty-cycle-locked-loop (PDCLL) 502. This system extends the PFD of FIG. 4B to provide a detector capable of simultaneously determining both phase and duty-cycle errors. The resulting detector is referred to as a phase-frequency-and-duty-cycle-detector (PFDCD) 504. In such a detector, both phase and duty-cycle errors are determined by comparing the relative timing of the rising- and falling-edges of the reference and feedback divider clocks.

Referring to FIG. 5, the duty-cycle loop comprises the PFDCD 504 coupled to a charge pump 508A and loop filter 510A, whose output is fed back to the input of the comparator 516. The PFDCD 504 measures the difference in duty-cycle between the divider and reference clocks. The error between them is converted to a charge by the CP 508A and this charge is integrated on the loop filter (LF) 510A. The LF 510A output is subtracted from the comparator 516 input, and by virtue of feedback action the low-frequency noise 520 at the comparator 516 input is cancelled, resulting in equalization of the reference and divider clock duty-cycles. The PFDCD 504 also measures the phase error between reference and divider clocks, and this phase error is driven to zero by the PLL loop.

A key component of the PDCLL is the PFDCD 504 circuit. This circuit compares the reference and divider clocks and infers the duty-cycle and phase errors using comparisons of the rising and falling edges of both clocks. The principle of operation may be understood with reference to FIG. 6. Exemplary waveforms on the left of the figure illustrate the response of rising and falling-edge PFDs with respect to a phase error among two clocks with matching duty cycles. In such a situation, both detectors will produce pulses of the same polarity in this example; they are "UP" pulses, as the reference phase is ahead of the divider phase. In contrast, the right of the figure illustrates the response of rising and falling-edge PFDs with respect to a duty-cycle error among two clocks of matching phase. In this case, the detectors produce pulses of opposite polarity—in this example, "DN" pulses for the rising edge detector and "UP" pulses for the falling edge detector.

Figure 6:
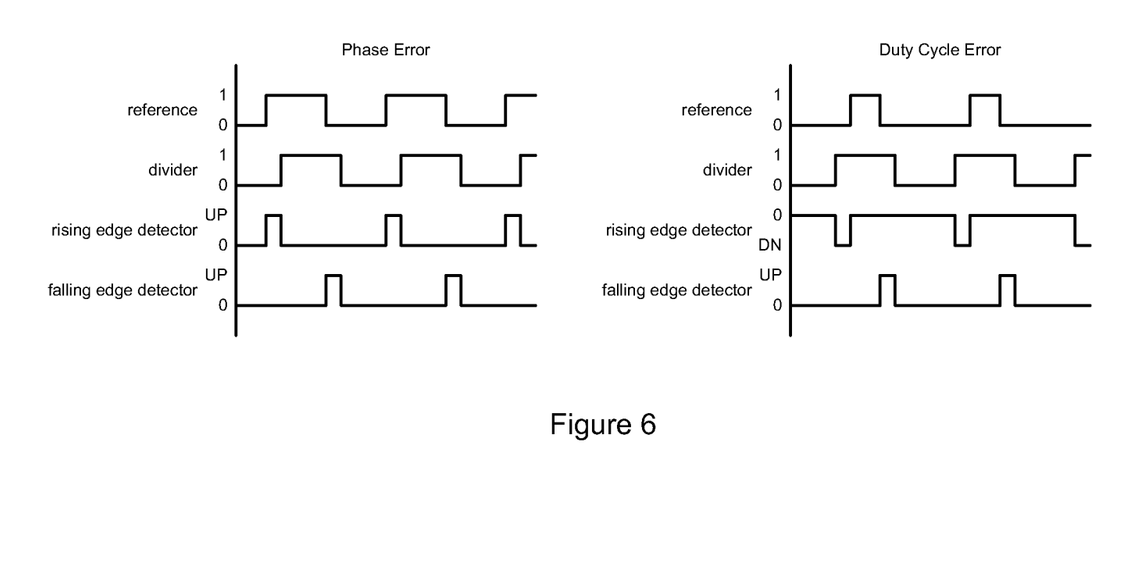
FIG. 6 are exemplary waveforms that illustrate the response of rising and falling-edge PFD's in the presence of phase and duty-cycle errors.

In the presence of phase error alone, the average of the sum of the two detector outputs gives a good indication of the phase error. Note that the average of the difference of the two detector outputs is zero, as both detectors produce pulses of the same duration. On the other hand, in the presence of duty-cycle error alone, the average of the difference of the two detector outputs gives a good indication of the duty-cycle error, whereas the average of the sum of the two outputs is zero. Thus, we see that a PFDCD can be constructed using a combination of positive and negative edge PFDs.

Figure 7:
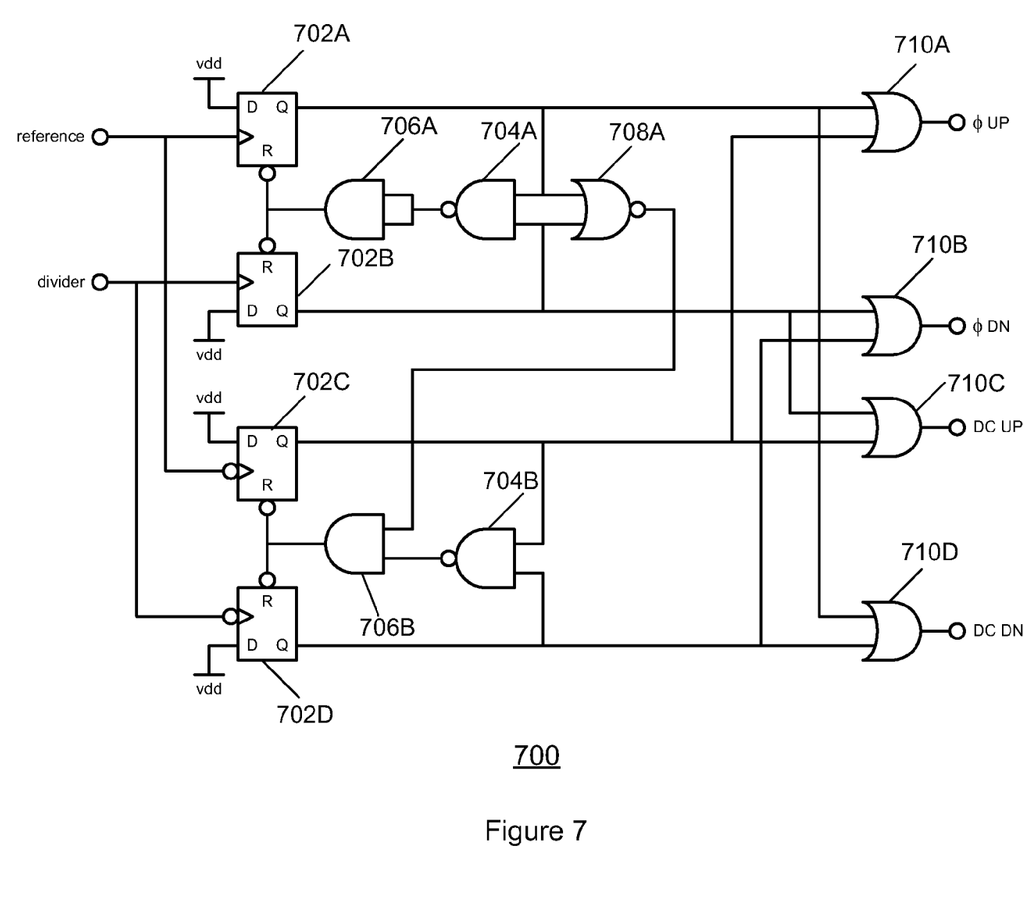
FIG. 7 is an embodiment of a phase-frequency and duty-cycle detector (PFDCD) in accordance with the present invention.

An embodiment of a PFDCD according to the present invention is found in FIG. 7. In this embodiment a positive edge PFD and a negative edge PFD are combined in a similar fashion to the PFD of FIG. 4B. The embodiment of FIG. 4B is extended to provide UP and DN signals for the duty-cycle loop by the addition of OR gates 710C and 710D. The phase-UP signal is formed by taking the OR of the two PFD UP signals, as before. That is, the VCO frequency should be increased when the rising or falling edges of the reference clock are early on average with respect to the divider clock. The duty-cycle UP signal is formed by taking the OR of the rising edge PFD DN signal with the falling-edge PFD UP signal. That is, the duty cycle of the reference should be increased when the rising edge of the reference is late or the falling edge is early, on average. In corresponding fashion, the phase-DN and duty-cycle-DN signals are formed by taking the logical OR of the corresponding PFD outputs. The net effect is that the phase UP and DN signals relate to the sum of the two PFD outputs, whereas the duty-cycle UP and DN signals relate to the difference.

When the PDCLL is operating in its steady-state condition, the rising and falling edges of reference and divider clocks will be in very close alignment, even in the presence of low-frequency noise and offset, such that the average outputs of each PFD is zero. In this ideal operating condition, the two PFD's produce pulses of minimum pulsewidth on alternating half-cycles of the reference clock in "ping-pong" fashion, and thus the four outputs of OR gates 710A-710D produce minimum pulsewidth pulses on every half-cycle of the reference clock. The minimum pulsewidth is only limited by the reset delay through gates 702A-702B, 704A and 706A for the rising-edge PFD and by the reset delay through gates 702C-702D, 704B and 706B for the falling-edge PFD. Thus, the high-frequency spurious products formerly produced by low-frequency noise and offsets are suppressed by mutual action of the phase-locked and duty-cycle locked loops.

As in FIG. 4B, to avoid an undesirable lock point in which the reference and divider clocks are 180-degrees out-of-phase, the PFDCD of FIG. 7 also includes an "inhibit" circuit comprising a NOR gate 708A and AND gate 706B that allows the rising-edge PFD to inhibit operation of the falling-edge PFD, thereby enforcing the "ping-pong" operation associated with the desirable in-phase lock point.

Figure 8:
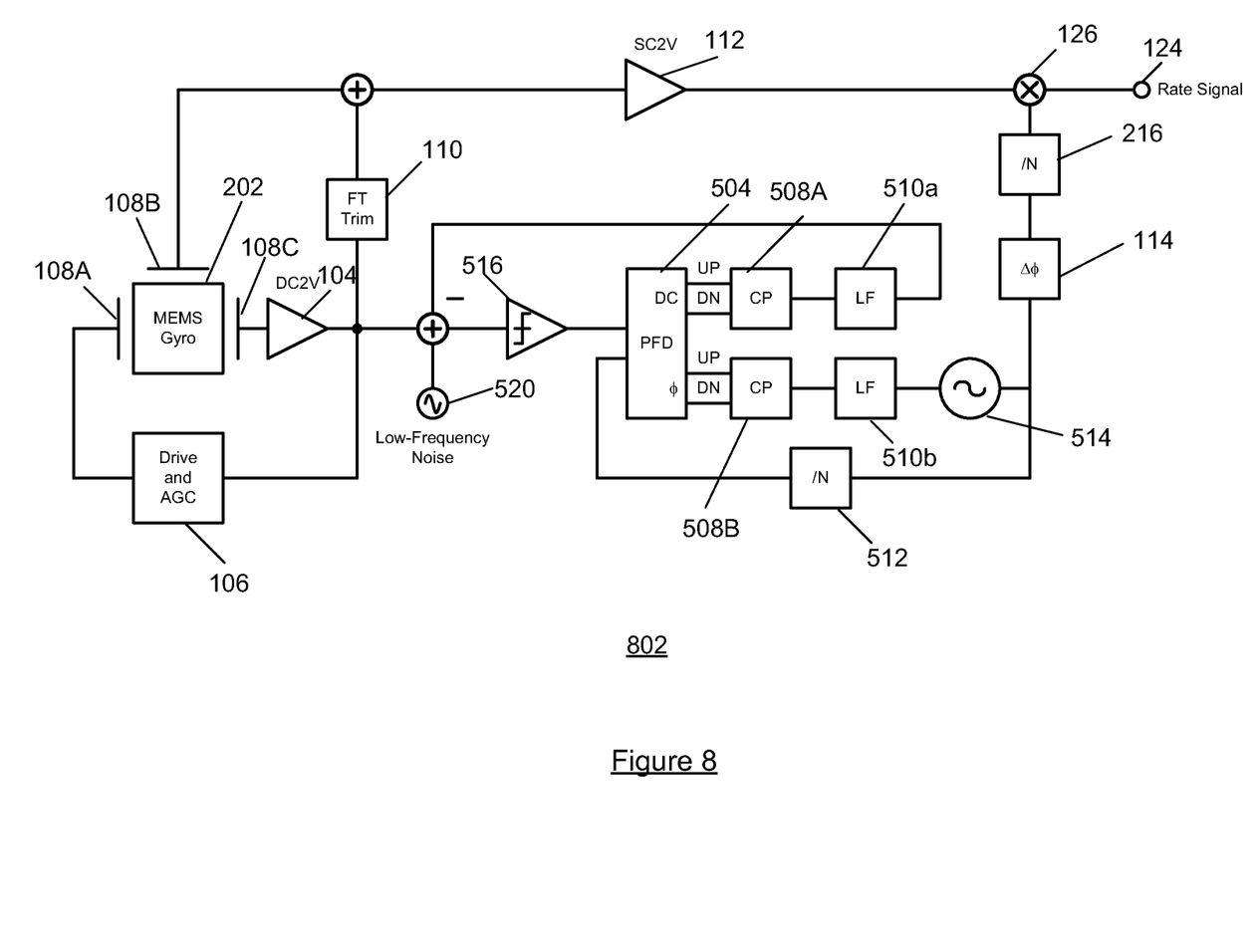
FIG. 8 is an embodiment of the present invention incorporating a PDCLL comprising a PFDCD.

An embodiment of the present invention incorporating a PDCLL comprising a PFDCD appears in FIG. 8. In this embodiment, a rate gyroscope 802 comprises a PDCLL in place of the PLL of FIG. 2. This preferred embodiment retains all of the aforementioned benefits of the embodiment of FIG. 2 with the added benefit that low-frequency noise 520 at the comparator 516 input is rejected by feedback action of the duty-cycle correction loop. The low-frequency noise arriving at the input to comparator 516 is now limited by the CP circuitry 508A and 508B in the PLL and duty-cycle loops. In steady-state operation, the CPs 508A and 508B will produce brief and simultaneous UP and DN pulses whose duration is set by the propagation delay of the D-FF and combinatorial logic gates in the RESET path of the PFD's. As these delays can easily be limited to a very small fraction of the reference clock period, the CPs 508A and 508B will only produce noise for brief intervals, and so the effect of low-frequency noise 520 generated by the CP 508A and 508B circuitry is greatly reduced by the "time-gated" operation of the PFDCD. This operation compares very favorably to conventional duty-cycle correction techniques, such as that illustrated in FIG. 1, in which the duty-cycle error is measured by measurement of the difference in "high" and "low" intervals of the comparator output. Such conventional techniques forego the noise reduction benefit of time-gating as the "high" and "low" intervals are continuously monitored, making low-noise operation much more difficult to achieve.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A gyroscope system comprising:
a MEMS gyroscope including a drive-sense terminal and a sense terminal;
a drive amplifier being coupled to the drive-sense terminal;
a sense amplifier being coupled to the sense terminal;
a demodulator including a signal input and a clock input;
a phase-locked loop (PLL);
a phase shifter; and
a first frequency divider; wherein, the output of the PLL is coupled to the phase shifter; the output of the phase shifter is coupled to the second frequency divider; the frequency divider is coupled to the clock input; the phase shifter is programmable to select the number of clock-cycle delays relating its input and output; the first frequency divider is operable to divide the frequency of the phase shifter output down to the drive frequency;
wherein,
the output of the drive amplifier is coupled to an input of the phase-locked loop;
an output of the sense amplifier is coupled to the signal input;
the MEMS gyroscope is operable to produce a signal at a drive frequency;
the demodulator is operable to demodulate a signal from the MEMS gyroscope;
the phase-locked loop is operable to suppress a phase error of the phase-locked loop input.

2. The gyroscope system of claim 1, the PLL further comprising:
a phase-frequency detector (PFD),
a charge pump (CP) coupled to the PFD,
a loop filter (LF) coupled to the CP,
a voltage-controlled oscillator (VCO) coupled to the LF
and a second frequency divider coupled in feedback fashion between the VCO and the PFD.

3. A gyroscope system comprising:
a MEMS gyroscope including a drive-sense terminal and a sense terminal;
a drive amplifier being coupled to the drive-sense terminal;
a sense amplifier being coupled to the sense terminal;
a demodulator including a signal input and a clock input;
a phase- and duty-cycle locked loop (PDCLL) comprising a reference clock and a divider clock;
wherein,
the output of the drive amplifier is coupled to an input of the phase and duty-cycle locked loop;
the output of the PDCLL is coupled to the clock input;
an output of the sense amplifier is coupled to the signal input;
the MEMS gyroscope is operable to produce a signal at a drive frequency;
the demodulator is operable to demodulate a signal from the MEMS gyroscope;
the PDCLL is operable to suppress a phase error between the reference clock and the divider clock using both rising and falling edges of the reference clock and the divider clock and the PDCLL is operable to suppress a duty-cycle error between the reference clock and the divider clock using both rising and falling edges of the reference clock and the divider clock.

4. The gyroscope system of claim 3, the PDCLL further comprising:
a phase-frequency and duty-cycle detector (PFDCD),
a charge pump coupled to the PFDCD,
a loop filter coupled to the charge pump and further coupled to the PFDCD input,
the PFDCD further operable to measure a duty-cycle error determined using both rising and falling edges of the phase- and duty-cycle locked loop input.

5. The gyroscope system of claim 4, the PDCLL further comprising:
a second charge pump (CP) coupled to the PFDCD,
a second loop filter (LF) coupled to the second CP,
a voltage-controlled oscillator coupled to the LF,
and a frequency divider coupled in feedback fashion between the voltage-controlled oscillator and the PFDCD,
the PFDCD operable to measure a phase error determined using both rising and falling edges of the phase- and duty-cycle locked loop input.

6. The gyroscope system of claim 3, further comprising:
a phase shifter,
a second frequency divider,
wherein,
the output of the PDCLL is further coupled to the phase shifter;
the output of the phase shifter is coupled to the second frequency divider;
the second frequency divider is coupled to the clock input of the demodulator;
the phase shifter is programmable to select the number of clock-cycle delays relating its input and output;
the second frequency divider is operable to divide the frequency of the phase shifter output down to the drive frequency.

7. A phase- and duty-cycle locked loop (PDCLL) comprising:
a phase locked loop (PLL) comprising a reference clock and a divider clock,
a duty-cycle correction loop, and
a phase-frequency and duty-cycle detector (PFDCD),
wherein,
the PFDCD is operable to measure a phase error between the reference clock and divider clock using both rising and falling edges of the reference clock and the divider clock and the PFDCD is operable to measure a duty-cycle error between the reference clock and divider clock using both rising and falling edges of the reference clock and the divider clock, the PLL is operable to substantially eliminate the phase error,
the duty-cycle correction loop is operable to substantially eliminate the duty-cycle error.

8. The phase- and duty-cycle locked loop of claim 7, further comprising:
a charge pump (CP) coupled to the PFDCD,
a loop filter (LF) coupled to the charge pump,
a voltage-controlled oscillator (VCO) coupled to the LF,
and a first frequency divider coupled in feedback fashion between the VCO and the PFDCD.

9. The phase- and duty-cycle locked loop of claim 8, further comprising:
a second charge pump coupled to the PFDCD,
a second loop filter coupled to the second charge pump and further coupled to the PFDCD input.

10. A method for simultaneous phase and duty-cycle correction, comprising the steps of:
receiving a reference clock comprising first rising and falling edges;
receiving a divider clock comprising second rising and falling edges;
measuring a first timing error between first and second rising edges;
measuring a second timing error between first and second falling edges;
computing a phase error comprising the sum of the first and second timing errors;
computing a duty-cycle error comprising the difference of the first and second timing errors;
adjusting a clock frequency responsive to the phase error such that the phase error is minimized; and
adjusting a clock duty-cycle responsive to the duty-cycle error such that the duty-cycle error is minimized.

11. A method for gyroscope rate signal demodulation, comprising the steps of:
receiving a drive-sense signal from a MEMS gyroscope;
receiving a sense signal from a MEMS gyroscope;
generating a reference clock comprising first rising and falling edges from the drive-sense signal;
generating an output clock with a frequency proportional to the drive-sense signal frequency;
generating a divider clock comprising second rising and falling edges from the output clock;
measuring a first timing error between first and second rising edges;
measuring a second timing error between first and second falling edges;
computing a phase error comprising the sum of the first and second timing errors;
computing a duty-cycle error comprising the difference of the first and second timing errors;
adjusting a clock frequency responsive to the phase error such that the phase error is minimized;
adjusting a clock duty-cycle responsive to the duty-cycle error such that the duty-cycle error is minimized;
demodulating the sense signal using a clock signal derived from the output clock.

12. The method of claim 11, further comprising the steps of:
delaying the output clock by a number of clock cycles to produce a delayed output clock;
dividing the frequency of the delayed output clock to produce a demodulator clock, such that the frequency of the demodulator clock equals the frequency of the drive-sense signal and the demodulator clock is phase-shifted relative to the drive-sense signal.

* * * * *